(12) United States Patent
Bryant et al.

(10) Patent No.: US 7,187,042 B2
(45) Date of Patent: Mar. 6, 2007

(54) BACKGATED FINFET HAVING DIFFERENT OXIDE THICKNESSES

(75) Inventors: Andres Bryant, Essex Junction, VT (US); Omer H. Dokumaci, Wappingers Falls, NY (US); Hussein I. Hanafi, Basking Ridge, NJ (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 11/365,504

(22) Filed: Mar. 2, 2006

(65) Prior Publication Data

US 2006/0145195 A1 Jul. 6, 2006

Related U.S. Application Data

(62) Division of application No. 10/709,323, filed on Apr. 28, 2004.

(51) Int. Cl.
*H01L 27/088* (2006.01)
(52) U.S. Cl. .............................. 257/401; 257/E29.264; 257/E29.275
(58) Field of Classification Search ...................... None
See application file for complete search history.

(56) References Cited

U.S. PATENT DOCUMENTS

| 6,433,609 | B1 | 8/2002 | Voldman |
| 6,448,615 | B1 | 9/2002 | Forbes et al. |
| 6,593,192 | B2 | 7/2003 | Zahurak et al. |
| 6,611,023 | B1 | 8/2003 | En et al. |
| 6,885,055 | B2 | 4/2005 | Lee |
| 2002/0105039 | A1 | 8/2002 | Hanafi et al. |
| 2003/0193070 | A1 | 10/2003 | Chan et al. |
| 2003/0209761 | A1 | 11/2003 | Yagishita et al. |
| 2004/0075122 | A1 | 4/2004 | Lin et al. |

FOREIGN PATENT DOCUMENTS

JP 2003-110109 4/2003

*Primary Examiner*—Asok Kumar Sarkar
(74) *Attorney, Agent, or Firm*—Joseph P. Abate, Esq.; Greenblum & Bernstein, P.L.C.

(57) ABSTRACT

A method of producing a backgated FinFET having different dielectric layer thickness on the front and back gate sides includes steps of introducing impurities into at least one side of a fin of a FinFET to enable formation of dielectric layers with different thicknesses. The impurity, which may be introduced by implantation, either enhances or retards dielectric formation.

9 Claims, 11 Drawing Sheets

BACKGATED FINFET HAVING DIFFERENT OXIDE THICKNESSES

CROSS REFERENCE TO RELATED APPLICATIONS

The present application is a divisional application of copending U.S. application Ser. No. 10/709,323 filed Apr. 28, 2004, which is incorporated herein by reference in its entirety.

FIELD OF THE INVENTION

The invention generally relates to a semiconductor device and method of manufacture and, more particularly, to a semiconductor device that includes FinFETs with different oxide thicknesses on front and back gates and a method of manufacture of such a device.

BACKGROUND DESCRIPTION

Conventional metal oxide semiconductor field effect transistors (MOSFETs) have a single control gate on a planar substrate. Single control of the channel often leads to undesired leakage current between the source and drain when the transistor is intended to be non-conductive. This becomes especially problematic as the critical dimensions of integrated circuits continue to decrease.

An improved planar structure employs two gates, one on each side of the channel. As this arrangement increases the electrostatic coupling between the gates and the channel, the drive current of the transistor is increased and the leakage current is decreased. Unfortunately, however, such planar double gate devices are difficult to manufacture.

One mode of operation of a double-gate FET is to switch the two gates simultaneously. Another use of the two gates is to switch only one gate and apply a bias to the second gate to dynamically alter the threshold voltage of the FET. This mode of operation is commonly called back-gate. Advantageously, the performance of a backgated chip can be fine tuned either dynamically or after manufacturing.

Backgated devices offer interesting improvements to device technology as the devices are scaled down. For metal gate devices, threshold voltage adjustment by doping results in buried layer devices. Backgated devices can be used to adjust the threshold voltage without creating buried layer devices.

Threshold voltage adjustment can also be achieved for fully depleted thin silicon devices by conventional doping. However, increased impurity scattering by additional dopants may cause a significant degradation in mobility and drive current.

FinFETs are an attractive alternative to planar double gated devices because FinFETs are much easier to manufacture. The body of a FinFET is formed from a vertical semiconductor structure, generally referred to as a "fin", that acts as a channel. A poly-Si layer may be deposited over the fin and patterned to form perfectly aligned gates straddling the fin. The fin terminates on both sides at the source and drain. Among the many advantages offered by FinFETs is better gate control at short gate lengths. FinFETs thus facilitate scaling of CMOS dimensions while maintaining an acceptable performance.

When gates are formed on both sides of the fin as described above, the device is generally referred to as a double gate FinFET. Use of a double gate suppresses short channel effects (SCE), provides for lower leakage, and provides for improved switching behavior.

The FinFET fabrication process can be modified to convert double gate FinFETs into backgated devices. One modification involves oxide thickness. In backgated devices, it is typically preferable to have a thicker oxide in the back-gate (i.e., the biased nonswitching gate) than in the front-gate to minimize front-gate to back-gate capacitance and source/drain to back-gate capacitance.

Oxides having different thicknesses may be grown on two sides of the fin of a FinFET when the fin is formed with a sidewall image transfer (SIT) process. However, growing two different thicknesses in the SIT process has shortcomings. For example, the oxide may be damaged during etching of a dummy gate or during reactive ion etching (RIE) of the opposite side of a fin, which are integral steps of the SIT process. Also, if the fin is produced using a process other than SIT, a different method for obtaining multiple oxide thicknesses is needed.

The invention is directed to overcoming one or more of the problems as set forth above.

SUMMARY OF INVENTION

In a first aspect of the invention, a method of fabricating a semiconductor structure is provided. The method entails forming a fin for a FinFET on a substrate. The fin has first and second sides. A first impurity is introduced on the first side of the fin. A dielectric layer is formed on the first and second sides. Due to the presence of the impurity, the dielectric layer is thicker on one of the first and second sides than the other of the first and second sides.

In a second aspect of the invention, a method of fabricating a semiconductor structure includes forming a fin for a FinFET on a substrate. The fin has first and second sides. A first impurity is directionally implanted on the first side of the fin. A dielectric layer is formed on the first and second sides of the fin. Due to the presence of the introduced impurity, the dielectric layer is thicker on one of the first and second sides than the other of the first and second sides. A FinFET gate having front and backgate sides and a top surface is also formed. The FinFET gate straddles the fin.

In a third aspect of the invention, a semiconductor structure is provided. The semiconductor structure includes a substrate and a fin for a FinFET on the substrate. The fin has first and second sides. The structure also includes a first impurity introduced on the first side of the fin. Additionally, a dielectric layer formed on the first and second sides of the fin is thicker on one of the first and second sides than the other of the first and second sides due to the presence of the introduced impurity.

DETAILED DESCRIPTION OF EMBODIMENTS OF THE INVENTION

An exemplary process according to the invention involves steps of introducing impurities into at least one side of a fin of a FinFET to enable formation of dielectric layers with different thicknesses. The impurity, which may be introduced by implantation, either enhances or retards dielectric formation having a thicker dielectric layer in the back-gate (i.e., the biased non-switching gate) than in the front-gate thereby reducing front-gate to back-gate capacitance as well as source and drain to back-gate capacitance.

Figure 1:
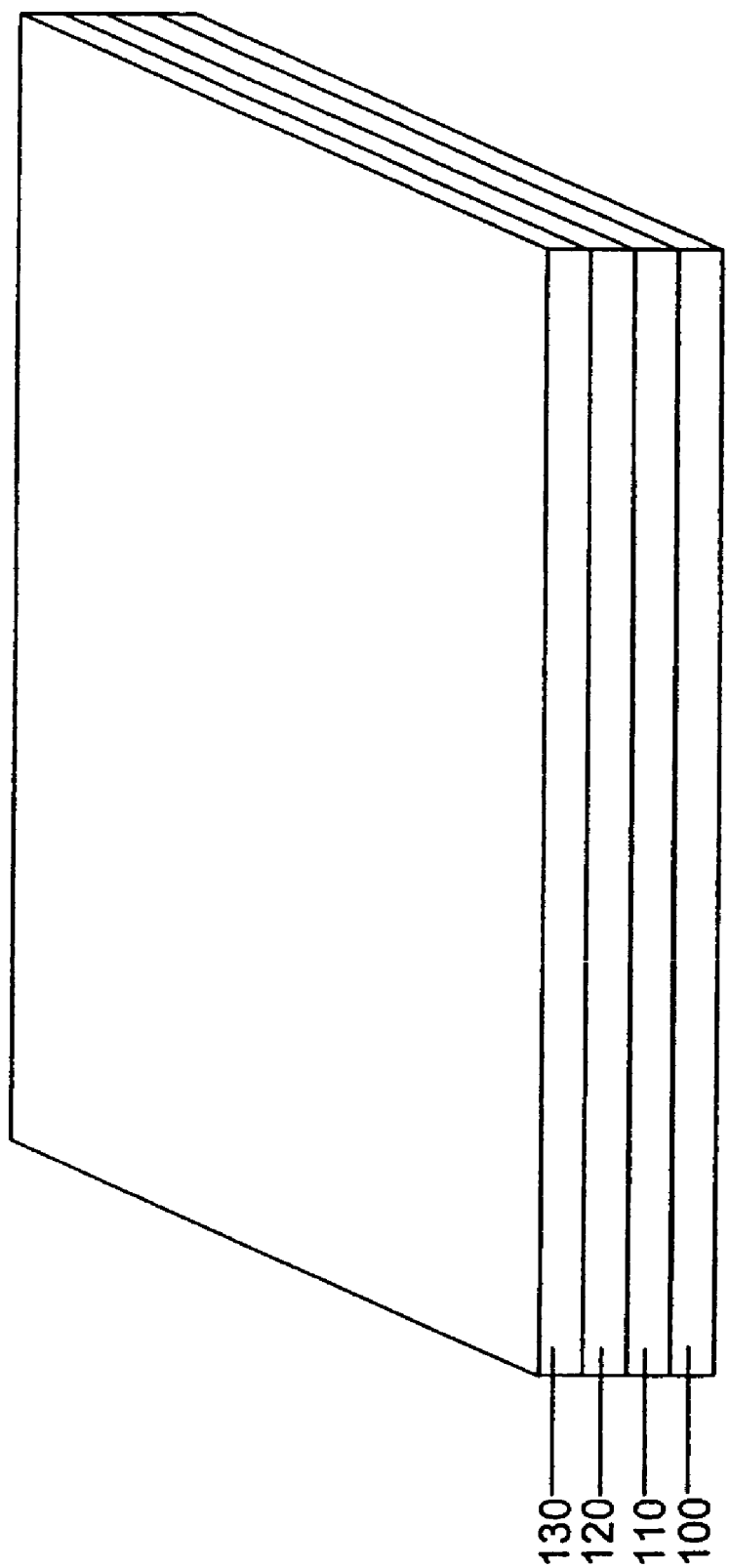
FIG. 1 shows an exemplary substrate structure upon which a FinFET may be formed according to the principles of the invention.

Referring now to FIG. 1, an exemplary substrate such as a silicon-on-insulator (SOI) structure is provided, including a silicon substrate layer 100, a buried oxide layer 110, and a silicon layer 120 on the buried oxide. The silicon layer 120 may, for example, have a thickness of approximately 50 nm, which determines the height of the fin (i.e., body of the transistor) to be formed, as described more fully below.

A hard mask 130 is formed in a conventional manner on the exposed surface of silicon layer 120. The hard mask may be comprised of an insulating layer such as silicon oxide, silicon nitride, a low dielectric constant material, or other suitable etchant insulator which allows the use of aggressive etch chemistries such as plasma etching. By way of example, a protective hard mask stack composed of $SiO_2$ and $Si_3N_4$ may be deposited by chemical vapor deposition over the silicon layer 120. The order of formation of the nitride layer and oxide layer may be reversed, or only one of the layers may be used instead of using both.

Figure 2:
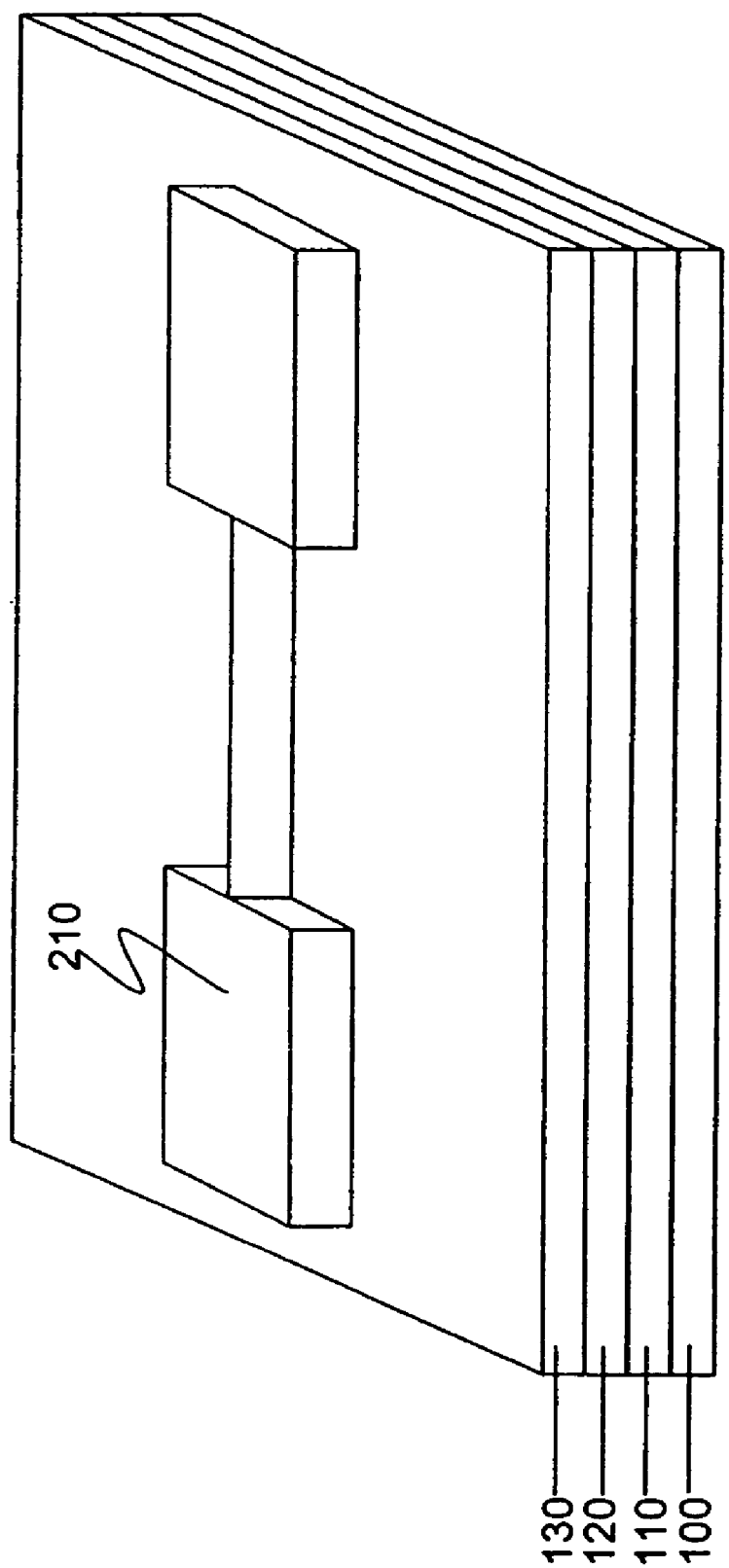
FIG. 2 shows an exemplary mask atop a substrate structure upon which a FinFET may be formed according to the principles of the invention.
Figure 3:
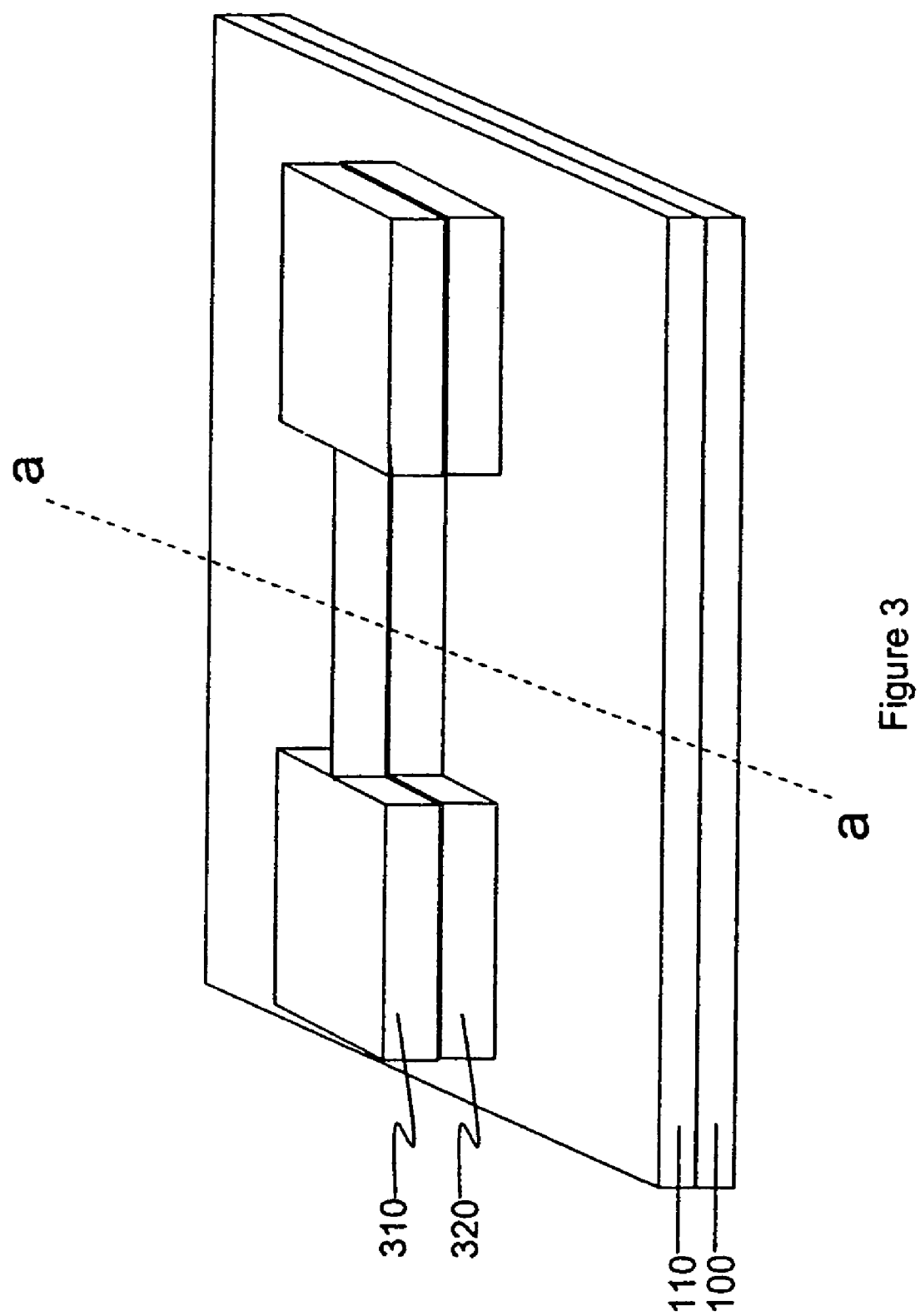
FIG. 3 shows an exemplary structure that has been etched to form a fin structure for a FinFET according to the principles of the invention.

After hard mask deposition, a photoresist may be applied to the hard mask to define a pattern through use of optical lithography, electron beam lithography, x-ray lithography, or other conventional means, to define a lithographic mask 210 as shown in FIG. 2. Next, an etch process is carried out to pattern the device fin structure 310, as shown in FIG. 3. A patterned portion of the hard mask 320 resides on top of the fin structure. Thereafter the lithographic mask 210 may be removed, resulting in a structure as shown in FIG. 3.

Those skilled in the art will appreciate that the fin structure 310 may be formed using various techniques, such as by blanket deposition of each layer followed by selective etching as described above, or by selective deposition of each layer. The particular method of fin formation is not important to the invention.

Figure 4:
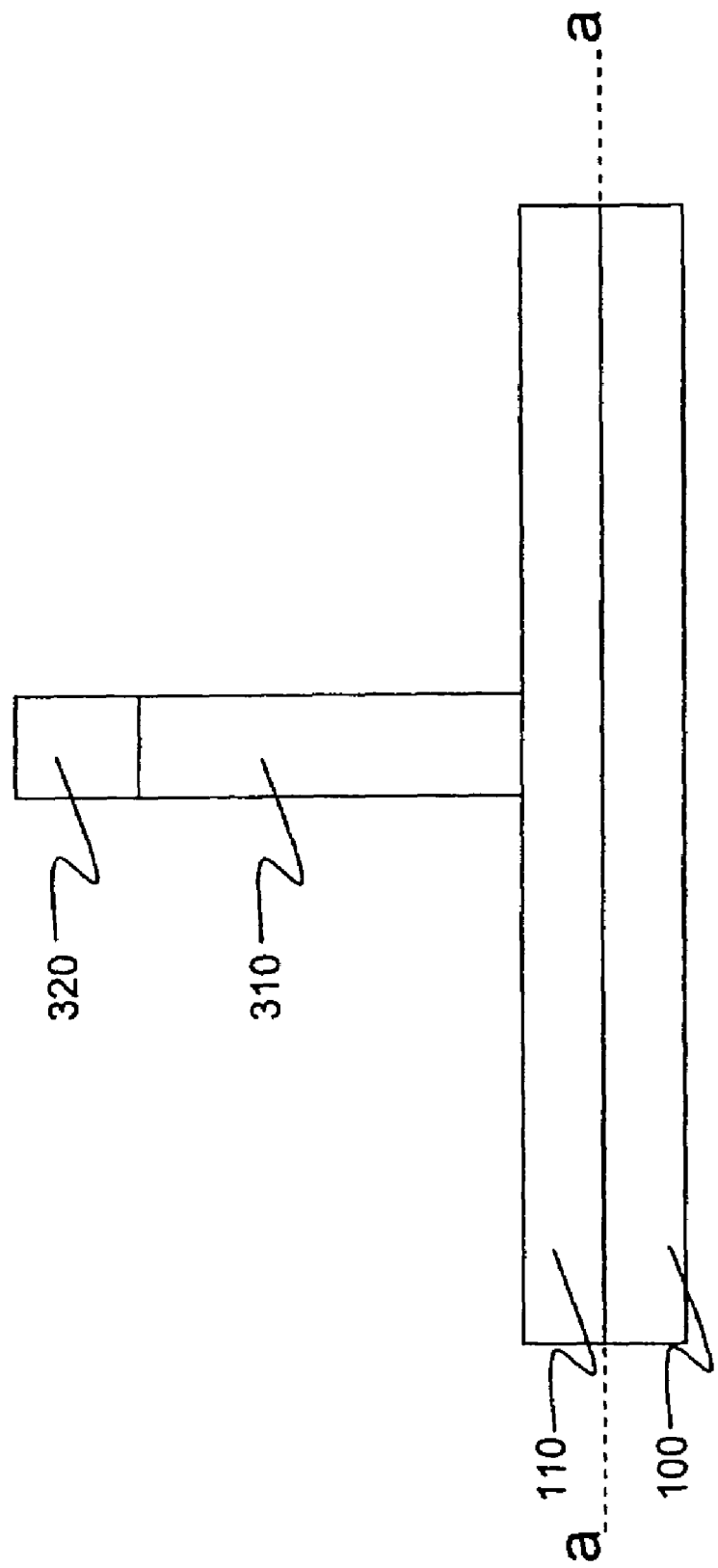
FIG. 4 shows a cross-sectional view of an exemplary semiconductor structure with a fin and hard mask according to the principles of the invention.

Now referring to FIG. 4, a cross sectional view of section a—a, from the structure of FIG. 3, is provided. The structure includes a semiconductor (e.g., silicon) fin 310 atop a buried oxide layer 110. A hard mask 320 remains atop the fin 310.

Figure 5:
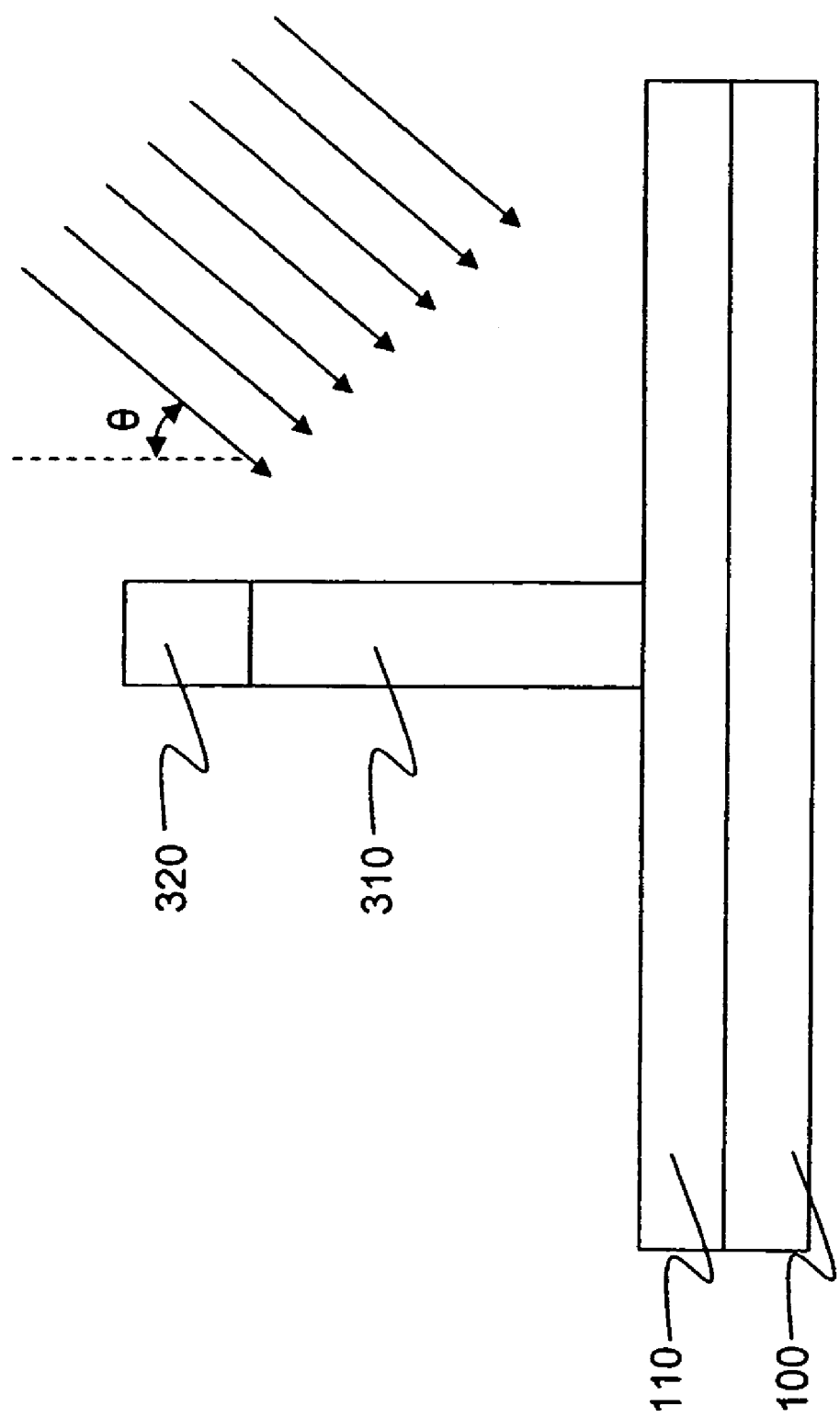
FIG. 5 shows an exemplary step of implanting an impurity into one side of an exemplary fin according to the principles of the invention.

Next, an impurity is directionally implanted into a side of the fin 310, as shown in FIG. 5. The impurity will either enhance or retard dielectric growth. If the impurity retards dielectric growth, then the side of the fin 310 having the implant will have a thinner dielectric layer than the opposite side of the fin 310. However, if the impurity enhances dielectric growth, then the implanted side will have the thicker dielectric layer. Of course, one side may have a retarding impurity and the other side may have an enhancing impurity without departing from the scope of the invention.

Implantation of the impurity enables forming a backgated FinFET with a front-gate having a different dielectric thickness than the control backgate. The backgate dielectric is usually the thicker layer. By way of example and not limitation, nitrogen or some other retarding impurity may be implanted in the front gate side to retard oxide dielectric growth on that side. Alternatively, silicon or argon or some other enhancing implant may be introduced to the backgate side to enhance oxide dielectric growth on that side. Other suitable implant species include heavy ions that will increase oxidation, such as cesium, oxygen and germanium. The impurities mention above may be implanted between 0.1 to 10 KeV at doses from $1e.sup.14$ to $1e.sup.16$ with title angles from approximately 10 to 45 degrees, as an example.

Illustratively, to implant nitrogen in the front gate side to retard oxide dielectric growth, a plasma nitridation process may be used. Remote plasma nitridation (RPN) using microwave or decoupled plasma nitridation (DPN) using radio frequency may interact with a nitrogen-containing gas to generate plasma containing nitrogen radicals.

The front gate side may be directionally targeted by the plasma that contains nitrogen. For example, directing the plasma at the front gate side at an angle from the vertical (e.g., 0=30.degree.) should avoid material implantation on the backgate side. The directional aspect of implantation is important to ensure that the implant does not uniformly affect the gate structure with the same impurity. If both sides of the gate are equally affected by the implant, the implant will not result in a difference in dielectric layer thickness.

An exemplary gas composition of the plasma is 75% helium and 25% nitrogen at a pressure of 20 to 80 mTorr. The plasma nitrogen concentration may vary, for example, from 10% to 25%, with helium, neon or argon providing the balance. A source of nitrogen is introduced into the plasma to form the nitrogen-containing plasma. The source of nitrogen may, for example, be $N_2$, $NH_3$, NO, $N_2O$, and/or mixtures thereof. The plasma may be applied at 10 to 50 W for 10 to 60 seconds.

During plasma nitridation, the fin 310 can be unbiased in which case the ionized substances are accelerated by the plasma potential and then implanted into the insulating surface. Alternatively, a bias voltage can be applied to the fin 310 to further accelerate the ions" movement from the plasma. Either a direct current or a radio frequency bias voltage can be used to bias the substrate. This step of the process thus introduces an impurity (e.g., nitrogen) solely or predominantly into one side of the fin (e.g., the front gate side) to affect (e.g., retard) dielectric growth.

A similar directional implantation process may be used to introduce some other retarding or enhancing impurity, e.g., argon or silicon, into a side of the fin, without departing from the scope of the invention. The particular directional implantation technique is not particularly important. Other techniques, now known or later developed, may be used to directionally implant a retarding or enhancing impurity into a side of the fin, without departing from the scope of the invention.

With the impurity implanted, the backgated FinFET can then be completed using conventional FinFET manufacturing processes. For illustrative purposes, a description of exemplary process steps will now be provided.

Figure 6:
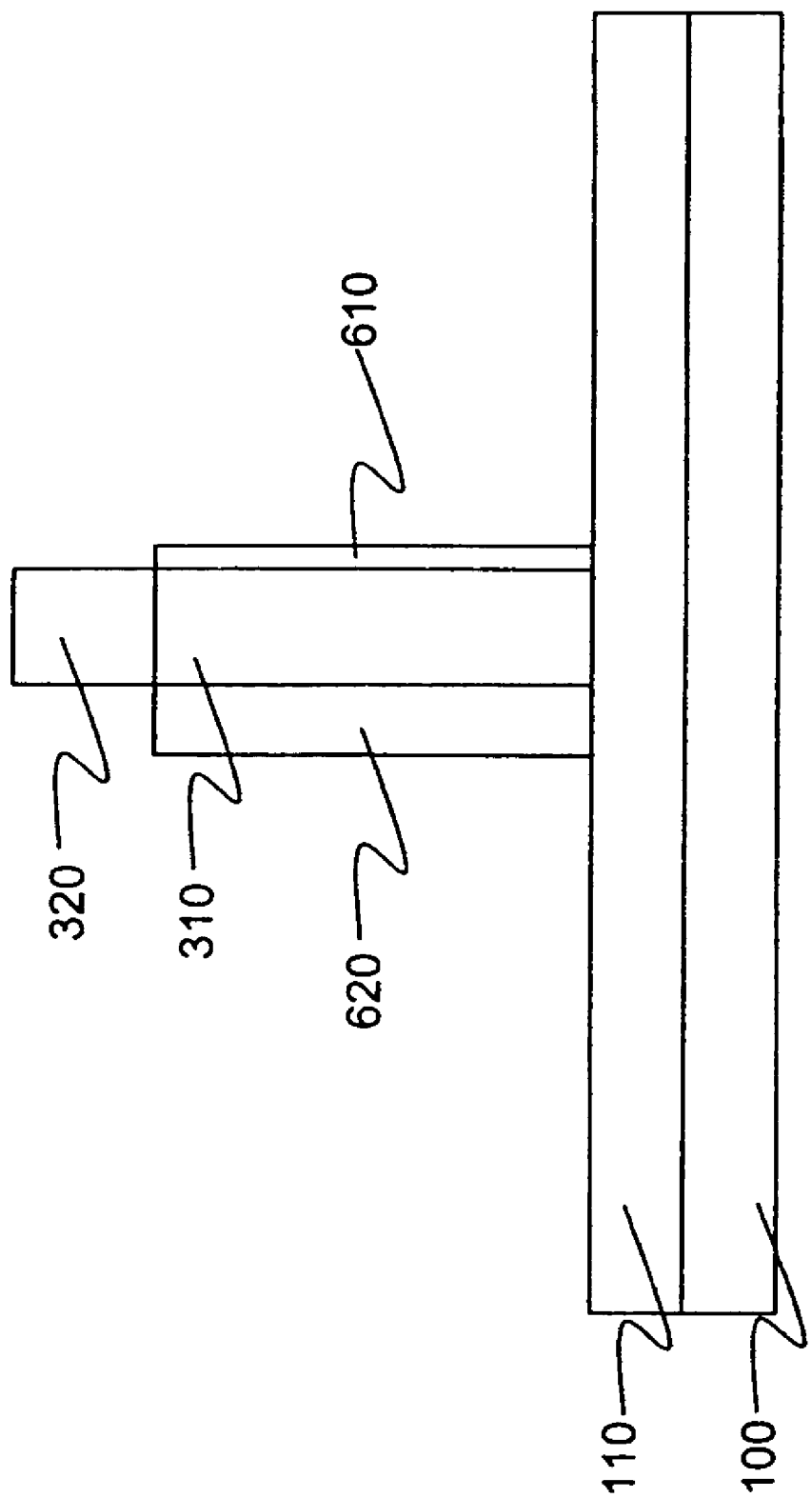
FIG. 6 shows an exemplary step of differential dielectric formation along sides of an exemplary fin according to the principles of the invention.

Referring now to FIG. 6, after implanting the impurity, a gate dielectric is grown or deposited on the fin. The dielectric may, for example, be thermally grown or deposited $SiO_2$, $Si_3N_4$, a high-K dielectric constant material, other dielectric insulators, or a combination thereof that is suitable for use as a FinFET gate dielectric. Of course, the dielectric should also be responsive to the implanted impurity, such that the impurity either enhances or retards dielectric formation as discussed above. Due to the implanted impurity, one side of the fin (e.g., the back-gate) will have a thicker dielectric layer having a thicker dielectric layer in the back-gate (i.e., the biased non-switching gate) than in the front-gate thereby reducing front-gate to body and back-gate capacitance as well as source and drain to back-gate capacitance.

Figure 7A:
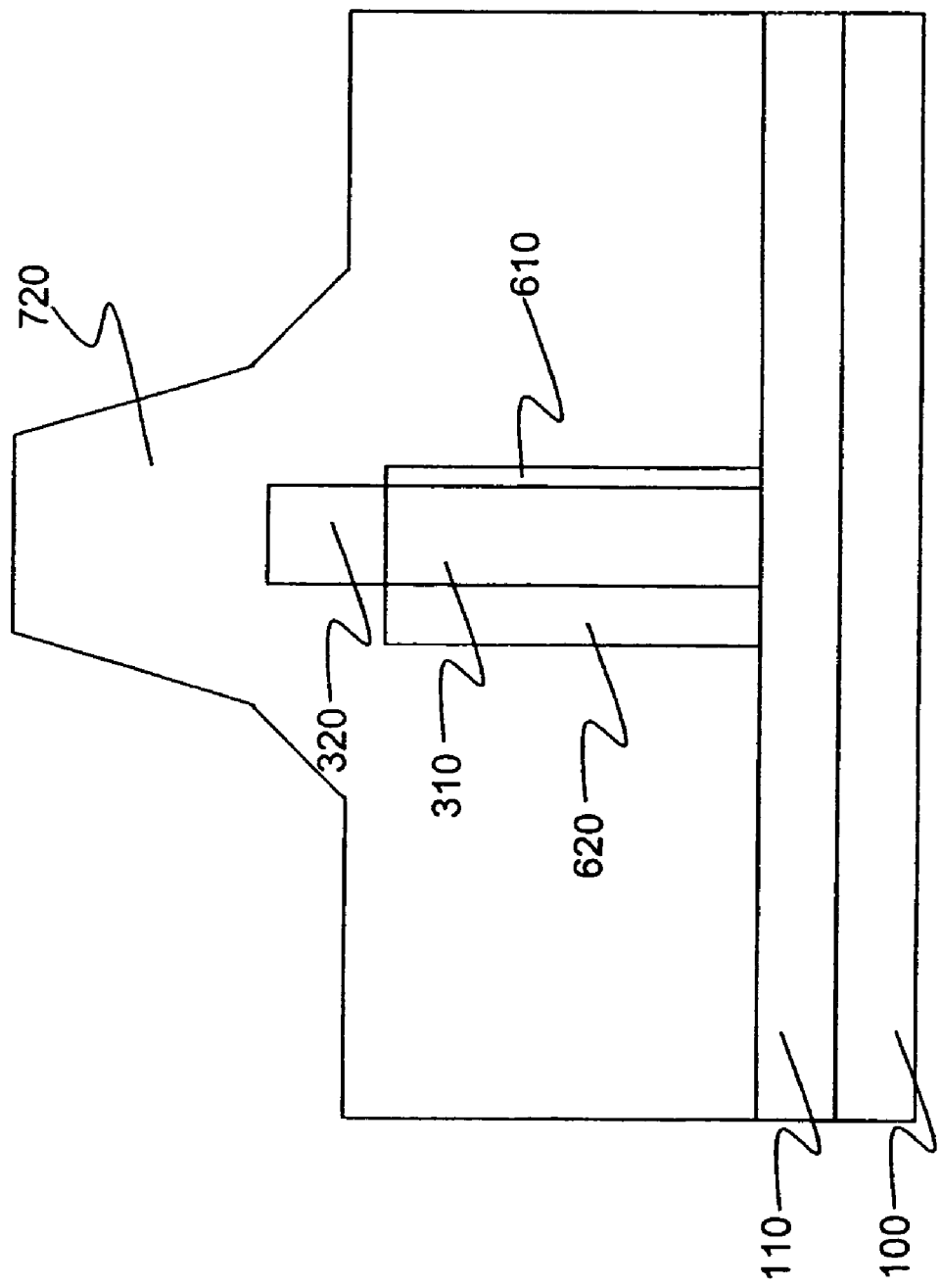
FIGS. 7A and 7B shows an exemplary step of formation of a gate straddling the exemplary fin according to the principles of the invention.
Figure 7B:
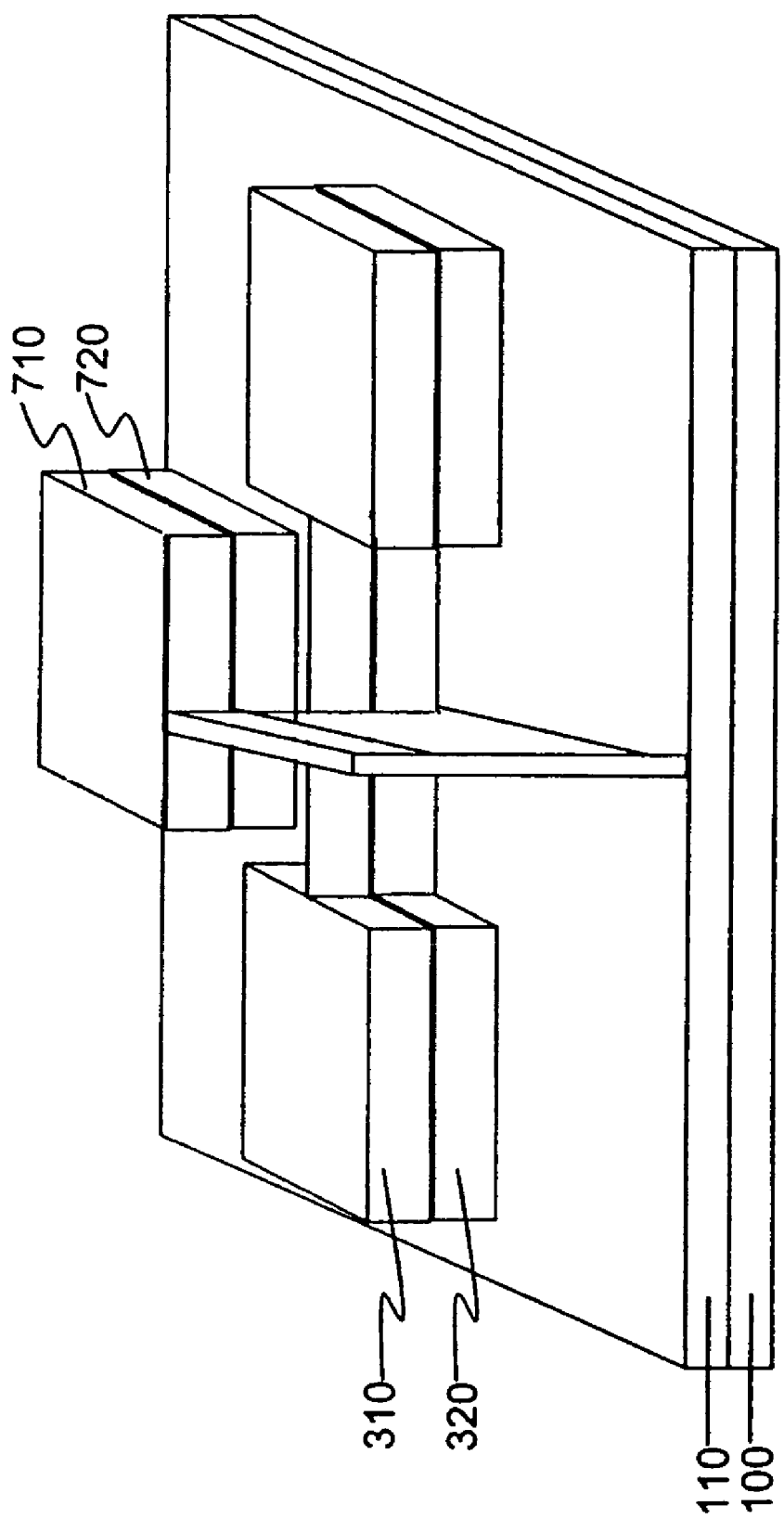

Next, a gate is formed straddling the fin as shown in FIGS. 7A and 7B. The gate material, which can be any conductive material suitable for FinFET gate composition, such as polysilicon, silicon-germanium, a refractory metal or a compound such as titanium nitride or molybdenum, is deposited over the surface of the structure in a conventional manner. As shown in FIG. 7B, a gate mask 710 is then defined in a conventional manner and the underlying gate material is etched to form gate 720 with the etching stopping on the gate dielectric (610–620 in FIG. 7A) and the buried oxide layer 110. The gate 720 is electrically isolated from the transistor structure by the gate dielectric 610 and 620 and the hard mask 320.

After forming the gate 720, the gate mask 710 can be stripped. This may be accomplished using any suitable mask removal technique, such as selective wet or dry etching.

Figure 8:
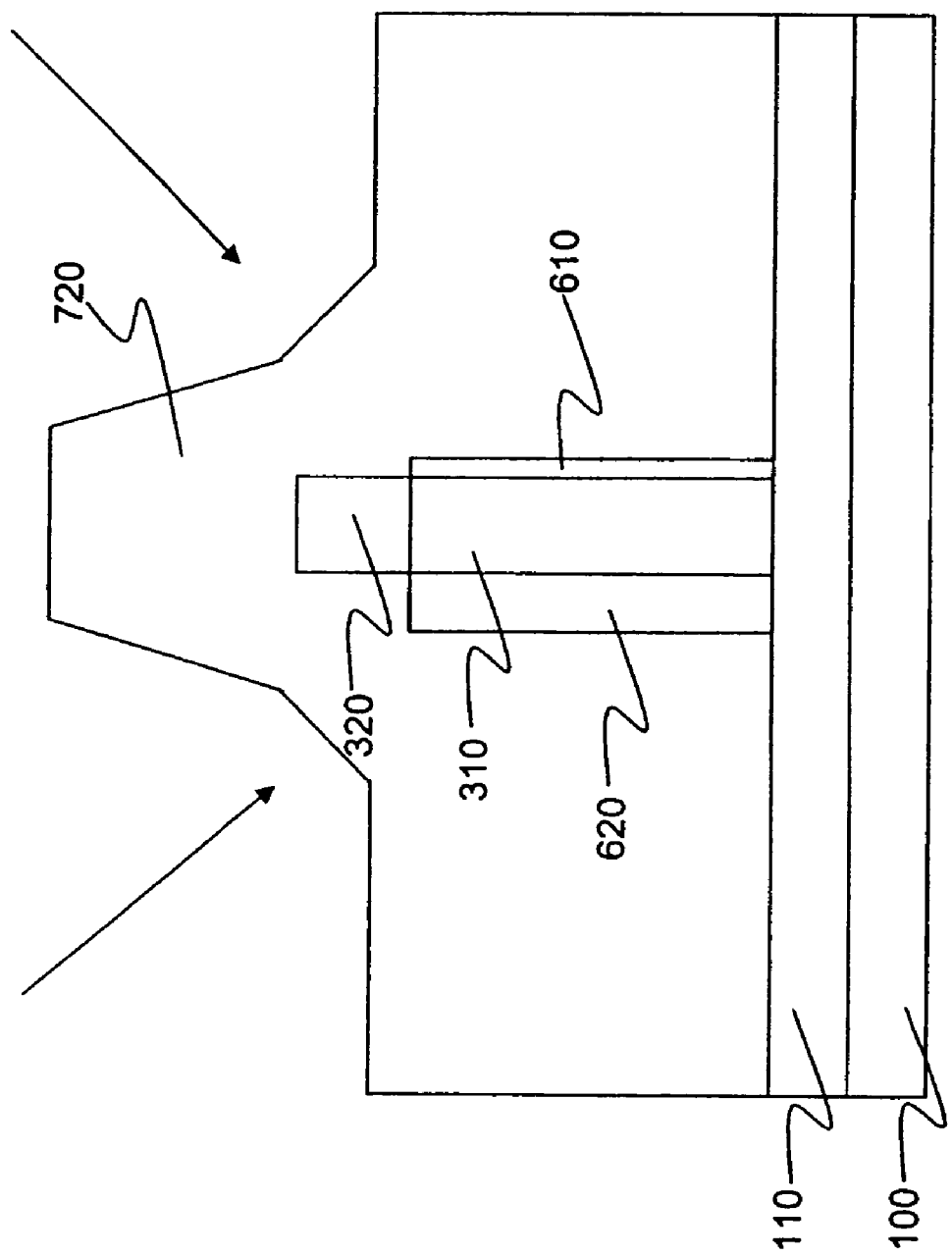
FIG. 8 shows a doping step according to the principles of the invention.

At this point, appropriate dopants may be implanted to form doped source and drain regions, gate regions and extension regions, as shown in FIG. 8. Doping of the source and drain regions make them electrically conductive. The gate may also be doped at this step if desired. Doping may be accomplished by high end implantation, gas immersion laser doping, ion shower doping, solid or gas source diffusion, or other conventional means. The dopant species is chosen to achieve the required device characteristics, for example, either N-type or P-type, including dopant concentrations. As is well known, P, As and Sb are suitable dopants for N-type regions, while B, In and Ga are suitable for P-type regions wells. Directional angled shallow ion implantation may be used to dope the source and drain regions, as well as gate regions. The direction of the implant is important to ensure that the implant does not uniformly affect different sides of the gate. A directional implant may be implemented using conventional directional ion implanting equipment, such as equipment capable of tilting wafers to predetermined angles of incidence with the dopant species being implanted. One dopant may be directionally introduced, then another may be introduced using another angled direction. Any implant damage or amorphization may be annealed through subsequent exposure to elevated temperatures.

Optionally, extension and halo implants may also be formed. For nFETs, typically B, In, or Ga are used for halo implants with energies in the range of 5 to 15 keV and a dose of $1\times10^{13}$ to $8\times10^{13}$ cm$^{-3}$. Similarly, for pFETs, P, As, or Sb are used for the halos, with energies from 20 to 45 keV and dose of $1\times10^{13}$ to $8\times10^{13}$ cm$^{-3}$.

Figure 9:
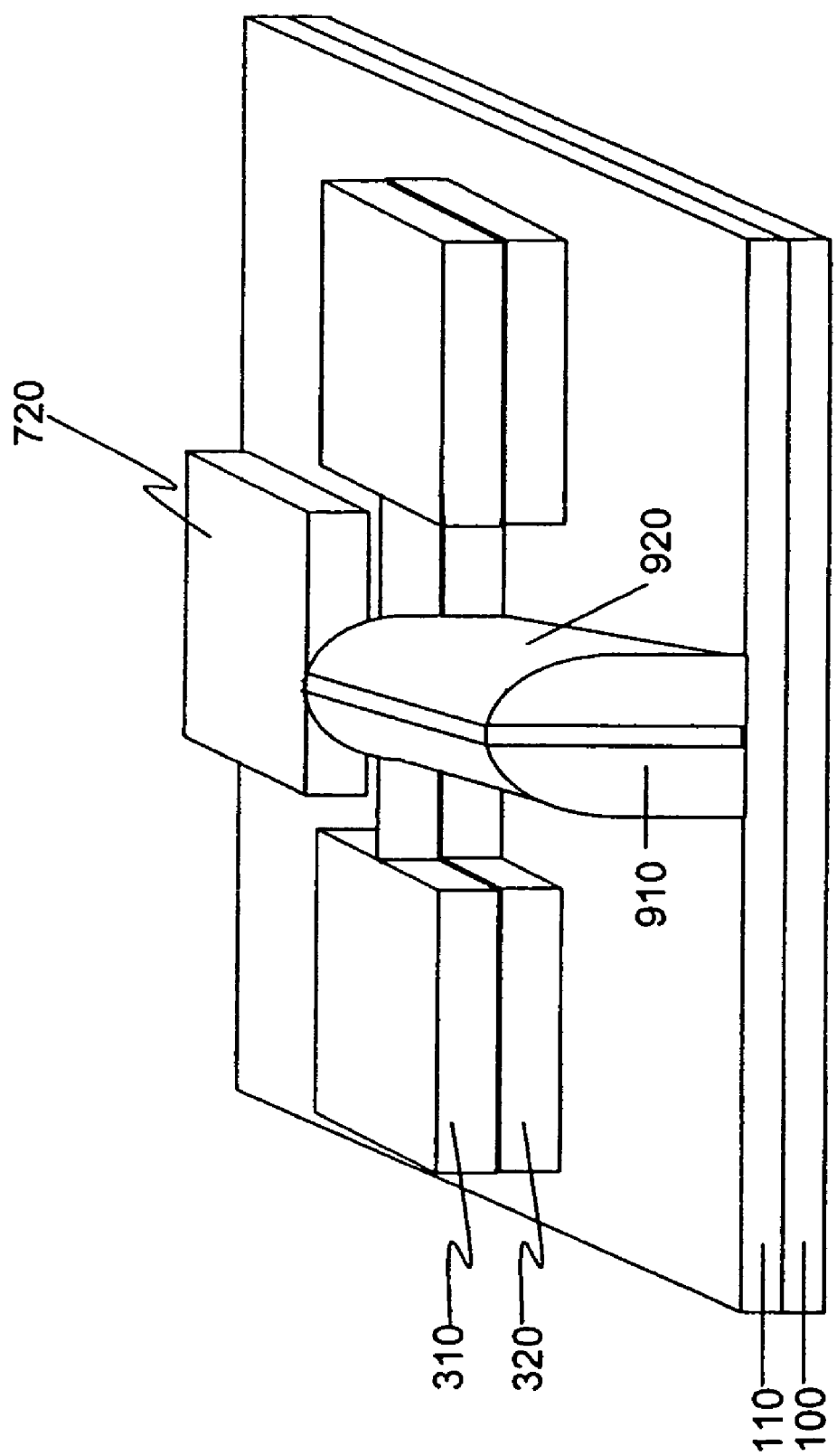
FIG. 9 shows a structure with spacers formed along the gate straddling a fin, according to the principles of the invention.

Next, a spacer may be formed along the sidewalls of the gate and the channel by deposition and selective etching of a dielectric such as silicon nitride or silicon dioxide. Spacer formations on the sidewalls of the channel may be removed, if desired, by additional etching, leaving gate spacers 910 and 920 on either side of gate as shown in FIG. 9.

After spacer formation, the hard mask over the source and drain can be removed to enable direct access to the underlying source and drain material. This can be achieved by anisotropically etching (e.g., reactive ion etching) the hard mask such that it is removed over the source and drain islands.

Figure 10:
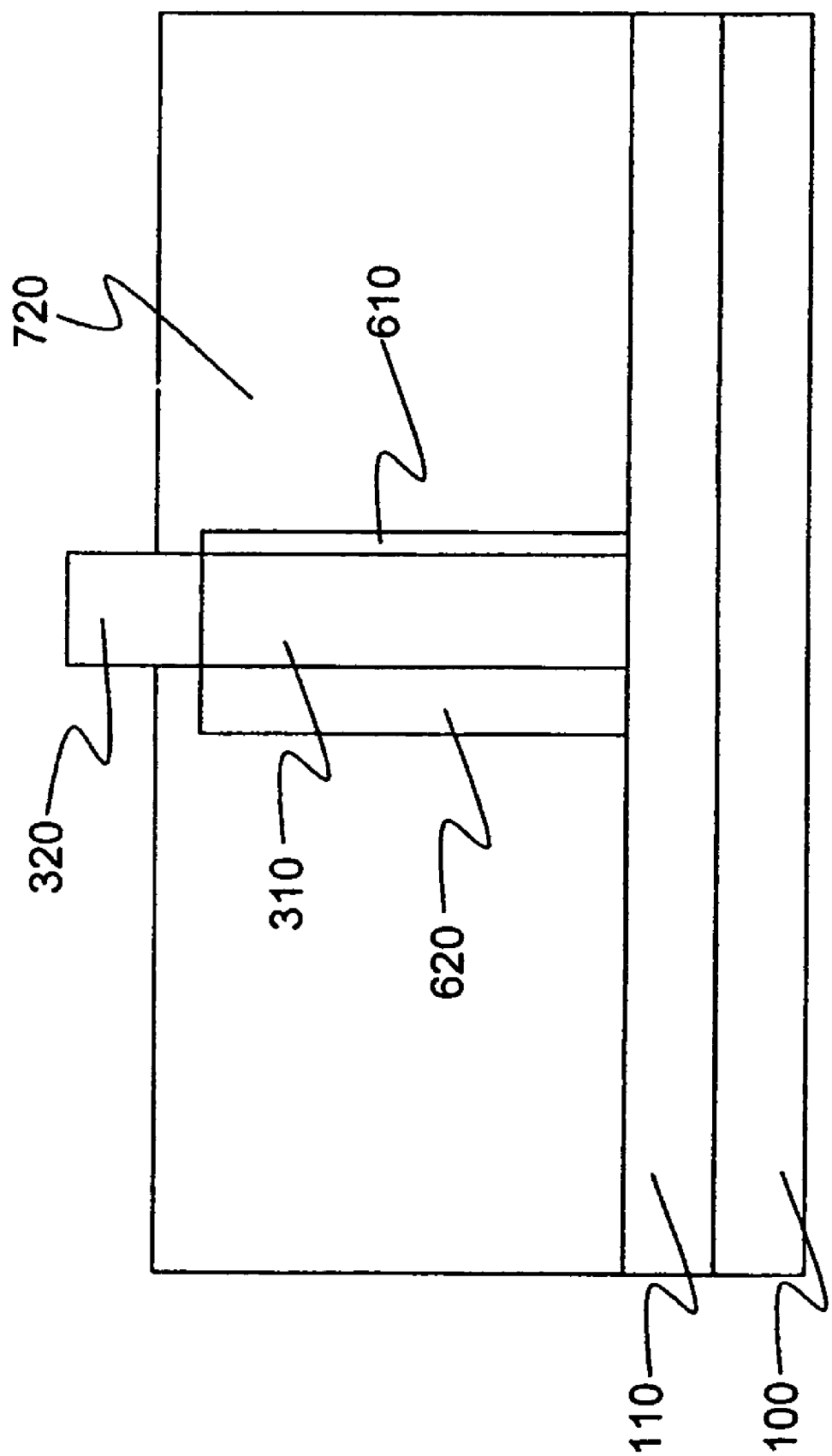
FIG. 10 shows a planarized structure according to the principles of the invention.

Subsequently, the surface may be chemically mechanically polished (CMP) to substantially level the gate height, as shown in FIG. 10. During formation, as the gate straddles the fin, there is usually a hump at the intersection of the structures. Chemical mechanical polishing in a conventional manner may reduce or eliminate the hump and substantially level the gate to the hard mask atop the fin.

To complete the device, contacts to sources, drains, and gates may then be formed. Accordingly, a dielectric may be deposited and planarized, for example, using a chemical mechanical polishing process. Contact holes may then be structured and etched using an anisotropic process (e.g., reactive ion etching) or the like. The contact holes may then be filled in a conventional manner using a conducting material, such as doped polysilicon, silicide (e.g., WSi), metals (e.g., Au, Al, Mo, W, Ta, Ti, Cu, or ITO (indium-tin oxide)), or the like, being deposited by evaporation, sputtering, or other known techniques, thereby forming source and drain contacts. Then a first metal layer may be deposited and structured using a reactive ion etching process or the like. Alternatively, the structuring of a first metal layer may be done following a damascene process flow.

The resulting structure includes a FinFET having different dielectric layer thickness on the front and back gate sides. Impurities introduced into at least one side of a fin of the FinFET enable formation of dielectric layers with different thicknesses. The impurity, which may be introduced by implantation, either enhances or retards dielectric formation.

While the invention has been described in terms of exemplary embodiments, those skilled in the art will recognize that the invention can be practiced with modifications and in the spirit and scope of the appended claims.

The invention claimed is:

1. A FinFET semiconductor structure, comprising: a substrate; a fin for a FinFET on the substrate, the fin having first and second sides; a first impurity on the first side of the fin; a dielectric layer on the first and second sides, the dielectric layer being thicker on one of the first and second sides than the other of the first and second sides, the introduced impurity affecting dielectric layer thickness.

2. The FinFET semiconductor structure according to claim 1, further comprising a gate straddling the fin, the gate having front and back gate sides and a top surface wherein the back gate side of the gate is backgated.

3. The FinFET semiconductor structure according to claim 2, wherein a bias is applied to the back gate side of the gate.

4. The FinFET semiconductor structure according to claim 3, further comprising a doping the gate regions on the structure.

5. The FinFET semiconductor structure according to claim 3, wherein an n-type impurity is implanted directionally on one side of the gate and a p-type impurity is implanted directionally on the other side of the gate.

6. The FinFET semiconductor structure according to claim 1, further comprising source and drain regions on the structure.

7. The FinFET semiconductor structure according to claim 1, further comprising directionally implanted source dopants in the source region; and directionally implanted drain dopants in the drain region.

8. The FinFET semiconductor structure according to claim 6, further comprising spacers abutting a FinFET gate straddling the fin.

9. The FinFET semiconductor structure according to claim 6, wherein the FinFET gate has a planarized top surface.

* * * * *